(12) United States Patent
Habu et al.

(10) Patent No.: US 8,156,620 B2
(45) Date of Patent: Apr. 17, 2012

(54) PROCESS OF MAKING AN ULTRASONIC PROBE

(75) Inventors: Takeshi Habu, Hachioji (JP); Takayuki Sasaki, Hachioji (JP)

(73) Assignee: Konica Minolta Medical & Graphic, Inc. (JP)

( * ) Notice: Subject to any disclaimer, the term of this patent is extended or adjusted under 35 U.S.C. 154(b) by 565 days.

(21) Appl. No.: 11/881,478

(22) Filed: Jul. 27, 2007

(65) Prior Publication Data

US 2008/0033298 A1 Feb. 7, 2008

(30) Foreign Application Priority Data

Aug. 2, 2006 (JP) ............................. JP2006-210673

(51) Int. Cl.
*H01L 41/18* (2006.01)
*H04R 17/10* (2006.01)
(52) U.S. Cl. ......... 29/25.35; 29/594; 310/334; 310/357; 252/62.9 PZ
(58) Field of Classification Search ............... 29/25.35, 29/594, 593; 310/317, 328, 334, 357, 311, 310/312, 348, 346; 252/62.9 R, 62.9 PZ
See application file for complete search history.

(56) References Cited

U.S. PATENT DOCUMENTS

| 3,902,083 | A | * | 8/1975 | Zoltan ........................... 310/317 |
| 5,153,859 | A | * | 10/1992 | Chatigny et al. ......... 29/25.35 X |
| 5,825,117 | A | * | 10/1998 | Ossmann et al. ............. 310/317 |
| 5,977,685 | A | * | 11/1999 | Kurita et al. .................. 310/311 |
| 6,965,680 | B2 | * | 11/2005 | Yamauchi et al. ........ 310/348 X |

FOREIGN PATENT DOCUMENTS

| JP | 63-252140 | | 10/1988 | |
| JP | 05284761 | A * | 10/1993 | ............... 29/25.35 X |
| JP | 8-187245 | | 7/1996 | |
| JP | 11-276478 | | 10/1999 | |
| JP | 2005-183478 | | 7/2005 | |

* cited by examiner

*Primary Examiner* — A. Dexter Tugbang
(74) *Attorney, Agent, or Firm* — Cantor Colburn LLP

(57) ABSTRACT

A method of producing an ultrasonic probe may include superimposing an ultrasonic wave receiving organic piezoelectric element layer made of an organic material on an ultrasonic wave transmitting inorganic piezoelectric element layer made of an inorganic material, and polarizing the ultrasonic wave receiving organic piezoelectric element layer and the ultrasonic wave transmitting inorganic piezoelectric element layer on a condition that the ultrasonic wave receiving organic piezoelectric element layer is superimposed on the ultrasonic wave transmitting inorganic piezoelectric element layer.

13 Claims, 2 Drawing Sheets

PROCESS OF MAKING AN ULTRASONIC PROBE

CROSS-REFERENCE TO RELATED APPLICATION

This application is based on Japanese Patent Application No. 2006-210673 filed on Aug. 2, 2006, in Japanese Patent Office, the entire content of which is hereby incorporated by reference.

BACKGROUND OF THE INVENTION

The present invention relates to an ultrasonic probe, and more particularly to an array-type ultrasonic probe improved into high-sensitivity for use in medical diagnostics.

An ultrasonic probe connected to an ultrasonograph (an ultrasonic diagnostic equipment) is used in contact with the surface of the patient's body. In other words, with the probe in contact with the surface of the patient's body, the ultrasonograph sends electric signals to the ultrasonic probe, a piezoelectric element inside the ultrasonic probe vibrates and emits ultrasonic waves into the patient's body. The ultrasonic waves sent are reflected by a tissue in the body, received by the ultrasonic probe and converted by the piezoelectric element into electric signals. These electric signals are further converted into image signals, and a display shows an image of the body tissue.

For this piezoelectric element for sending electric signals, a piezoelectric element is in most instances one-dimensionally placed in a single-type probe or two-dimensionally placed in an array-type probe. The array type is capable of obtaining images with good fineness, so is widely used as an ultrasonograph for medical diagnostic examination.

On the other hand, for imaging, harmonic imaging technology using higher harmonics signals plays a greater and greater role as standard diagnostic imaging technology, because of its capability of obtaining images with good clarity that have not been available through conventional B-mode diagnosis.

Higher harmonics signals used in harmonic imaging technology have a lot of advantages over fundamental waves:

(1) Lower side-lobe level gives good S/N ratio and contrast resolution.

(2) Higher frequency leads to a thinner beam and better lateral resolution.

(3) Small degree and small fluctuation of short-distance acoustic pressure causes no multiple echo.

(4) The attenuation beyond focal point equals that of fundamental waves, so makes greater depth velocity possible than ultrasonic waves having higher harmonics frequency as fundamental waves.

For a piezoelectric element making up an array-type ultrasonic probe for harmonic imaging technology, a broadband piezoelectric element has been used. The method has been generally used in which the broadband property has a low-frequency domain for sending fundamental waves and a high-frequency domain for receiving higher harmonics waves. Besides, for a technique for enhancing sensitivity, the conventional wisdom tells "a technology in which minute columnar piezoelectric elements are fixed with an organic compound like epoxy resin to manufacture a probe, the probe is used as an element for emitting and receiving ultrasonic waves, and each columnar piezoelectric element is caused to longitudinally vibrate to obtain better sensitivity" (see Japanese Application Patent Laid-Open Publication No. Sho 63-252140).

In this technology, however, narrow-band ultrasonic waves are used so that the spectrum of ultrasonic waves for emitting fundamental waves can have little possibility of overlapping with that of ultrasonic waves for receiving higher harmonics. This gives rise to the problem that narrow-band ultrasonic waves, since in general being long-tailing ultrasonic pulse signals, undesirably affect the resolution in the depth direction.

Another concrete composition of the array-type ultrasonic probe for harmonic imaging technology has been presented by a probe having emission separate from receiving in which a piezoelectric vibrator for emission and a piezoelectric vibrator for receiving are implemented and placed separately (see Japanese Application Patent Laid-Open Publication No. Hei 8-187245 or Japanese Application Patent Laid-Open Publication No. Hei 11-276478).

In addition, the conventional wisdom tells "a technology in which fundamental waves are emitted and ultrasonic waves including higher harmonics are received by arraying a plurality of first piezoelectric elements having primary acoustic impedance to emit and receive ultrasonic waves whose center frequency is f1, thus by implementing a first piezoelectric layer, arraying a plurality of second piezoelectric elements having secondary acoustic impedance to emit and receive ultrasonic waves whose center frequency is f2, thus by implementing a second piezoelectric layer and by overlapping these first and second piezoelectric layers" (See Japanese Application Patent Laid-Open Publication No. Hei 11-276478). But with this technology it is still impossible to obtain sufficient sensitivity.

Further, an element for emitting and receiving ultrasonic waves is improved in sensitivity by the laminating of inorganic piezoelectric elements, the enhancing of the electric consistency with the driving circuit by decreasing the apparent impedance and the increasing of emission sensitivity by enlarging the electric field intensity applied to elements and thus by producing large distortion (see Japanese Application Patent Laid-Open Publication No. 2005-183478). Though this laminating structure increases emission sensitivity in accordance with the number of lamination layers, however, receiving sensitivity is inversely proportional to the number of lamination layers, which is undesirable to harmonic imaging technology.

SUMMARY

In view of the foregoing problems, it is the object of the present invention to provide an array-type ultrasonic piezoelectric element having an emission piezoelectric element separate from a receiving piezoelectric element and improved into high sensitivity and low-cost in an ultrasonic probe for use in equipment like a medical diagnostic ultrasonograph.

The above object can be attained by structures and methods described in the following Items.

1. An ultrasonic probe for transmitting and receiving an ultrasonic wave, comprises:

a transmission-use inorganic piezoelectric element layer made of an inorganic material and for transmitting an ultrasonic wave;

an organic piezoelectric element layer made of an organic material and for receiving an ultrasonic wave; and an electrode layer provided between the inorganic piezoelectric element layer and the organic piezoelectric element layer.

2. The ultrasonic probe described in Item 1, further comprising:

a binder layer provided between the electrode layer and the organic piezoelectric element layer.

3. The ultrasonic probe described in Item 2, wherein a surface of the binder layer coming in contact with the organic piezoelectric element layer is made to be a rough surface.
4. The ultrasonic probe described in Item 3, wherein the surface of the binder layer has an arithmetic average roughness of 0.2 to 0.6 μm.
5. The ultrasonic probe described in Item 1, wherein the inorganic material is PZT, crystal, lithium niobate ($LiNbO_3$), potassium niobate tantalate [K (Ta, Nb) $O_3$], barium titanate, ($BaTiO_3$), lithium tantalite ($LiTaO_3$), strontium titanate ($SrTiO_3$) or bismuth titanate ($BiTiO_3$).
6. The ultrasonic probe described in Item 1, wherein the organic material is a resin containing a composition selected from a group of polyvinylidene fluoride, poly urea, polyamide, polyimide, polyester and polyolefin in an amount of 60 mol % to 100 mol %.
7. The ultrasonic probe described in Item 1, wherein the binder is composed of polyvinylbutyral, polyolefin, polycycloolefin, polyacrylate, polyamide, polyimide, polyester, polysulfone, epoxy compound, or silicone.
8. A method of producing an ultrasonic probe, comprising the steps of:
superimposing an ultrasonic wave receiving piezoelectric element layer on an ultrasonic wave transmitting piezoelectric element layer; and
polarizing the ultrasonic wave receiving piezoelectric element layer and the ultrasonic wave transmitting piezoelectric element layer on a condition that the ultrasonic wave receiving piezoelectric element layer is superimposed on the ultrasonic wave transmitting piezoelectric element layer.
9. The method described in Item 8, wherein the polarizing step is conducted with a DC voltage applying step, a AC voltage applying step or a corona discharging step.
10. The method described in Item 9, wherein the polarizing step is conducted with a polarizing density of 1 to 1000 $kW/m^2$/minute.
11. The method described in Item 9, wherein in the corona discharging step, a corona is discharged onto a surface of the ultrasonic wave transmitting piezoelectric element layer.
12. The method described in Item 9, wherein in the DC voltage applying step, the DC voltage is applied intermittently in a form of pulse.

With the present invention, it can be possible to provide an array-type ultrasonic piezoelectric element having an emission piezoelectric element separate from a receiving piezoelectric element and improved into high sensitivity and low-cost in an ultrasonic probe for use in equipment like a medical diagnostic.

Further, according to the present invention, forming a transmission-use inorganic piezoelectric element, coating an organic material to form an organic piezoelectric element coat and then applying this finish to polarizing process makes unyielding bonding and effective polarization possible. This object can be achieved according to the present invention by forming one layer of or a lamination of sheet-shaped piezoelectric inorganic matter composing each channel to manufacture a piezoelectric element for emission, by coating this element with sheet-shaped piezoelectric element material for receiving, by laminating these coatings and then by applying the finish to a polarizing process to obtain a high-sensitivity ultrasonic probe.

DETAILED DESCRIPTION OF THE PREFERRED EMBODIMENT

Now, best modes of carrying out the present invention will be described, but not intended as definitions of the limits of the invention.

According to the present invention, an ultrasonic probe for transmitting and receiving an ultrasonic wave, is characterized by comprising:
a transmission-use inorganic piezoelectric element layer made of an inorganic material and for transmitting an ultrasonic wave;
an organic piezoelectric element layer made of an organic material and for receiving an ultrasonic wave; and
an electrode layer provided between the inorganic piezoelectric element layer and the organic piezoelectric element layer.

Now, the embodiments of the present invention will be described with reference to FIGS. 1 to 4.

Embodiments

Figure 1:
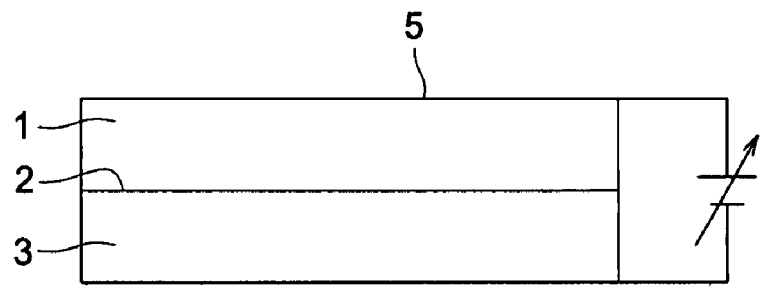
FIG. 1 is a schematic illustration of a polarizing process employing the electrodes of a transmission-use inorganic piezoelectric element surface and an organic piezoelectric element surface
Figure 2:
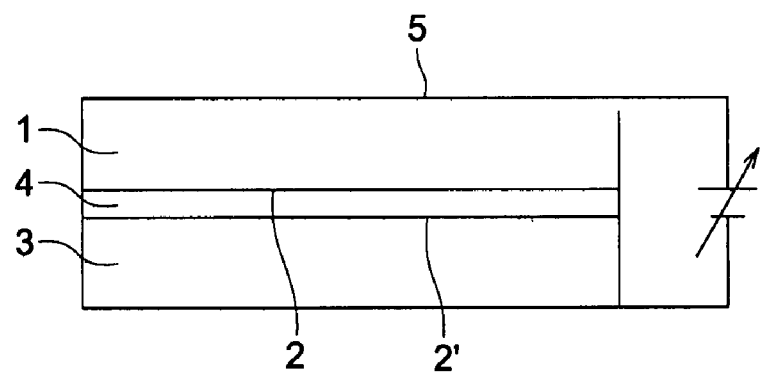
FIG. 2 is a schematic illustration of a polarizing process when there is an acoustic consistency layer
Figure 3:
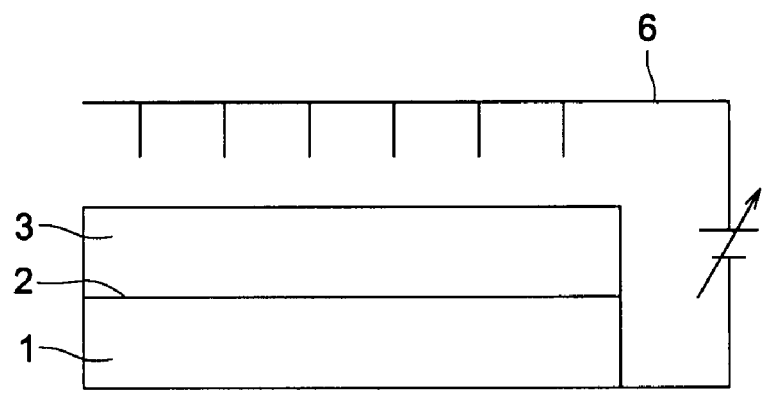
FIG. 3 is a schematic illustration of a polarizing process during corona discharge treatment
Figure 4:
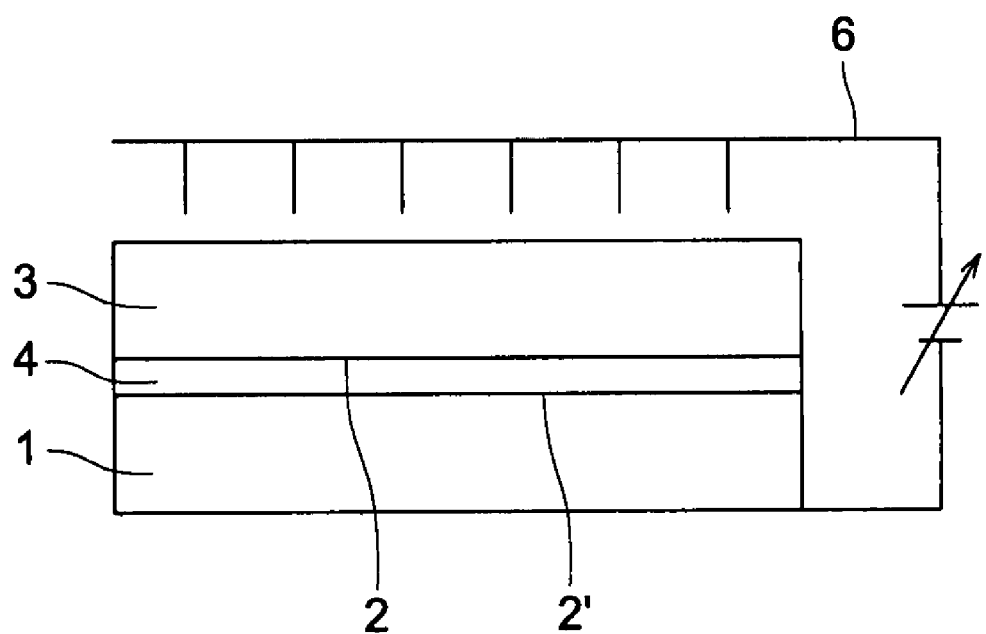
FIG. 4 is a schematic illustration of a polarizing process during corona discharge treatment

FIG. 1 is the schematic illustration of a mode carrying out the present invention in which a transmission inorganic piezoelectric element for transmitting ultrasonic waves overlaps with a reception organic piezoelectric element for receiving ultrasonic waves and then a polarizing process is performed. FIG. 2 is the schematic illustration of a mode as shown in FIG. 1, in which a transmission inorganic piezoelectric layer and a reception organic piezoelectric layer for receiving ultrasonic waves have an acoustic consistency layer existing in between. FIG. 3 is the schematic illustration of a mode as shown in FIG. 1, in which the side of an inorganic piezoelectric layer for transmitting ultrasonic waves has a comb-like electrode placed and then corona discharge treatment is performed for a polarizing process. FIG. 4 is the schematic illustration of a mode as shown in FIG. 3, in which an inorganic piezoelectric layer for transmitting ultrasonic waves and an organic piezoelectric layer for receiving ultrasonic waves have an acoustic consistency layer located in between.

In FIG. 1 to FIG. 4, the numeral 1 represents a reception-use organic piezoelectric element (an organic piezoelectric layer), 2 an electrode layer, 3 a transmission-use inorganic piezoelectric element (an transmission-use inorganic piezoelectric layer, 4 an acoustic consistency layer, 5 an electrode for a polarizing process, and 6 an electrode for corona discharge treatment.

Referring now to FIG. 1, where there is shown a mode of carrying out the present invention, the composition of an ultrasonic probe and a method for manufacturing the probe will be described.

As shown in FIG. 1, an element having an emission piezoelectric element separate from a receiving piezoelectric element is so constructed that a transmission-use inorganic piezoelectric element 3 overlaps with a reception-use organic piezoelectric element 1. The inorganic piezoelectric element 3, as shown in FIG. 1, may be so constructed that filmy piezoelectric thin plates overlap or is laminated on an electrode layer. An inorganic piezoelectric sheet to form the inorganic piezoelectric element can be obtained by, for instance, shaping a raw material powder of inorganic piezoelectric ceramic in a sheet with pressure and by burning and baking the sheet. It is easy to obtain the inorganic piezoelectric sheets not thicker than 100 μm, so it is possible to specify the thickness of each layer depending on whether or not there is an electrode.

The reception-use organic piezoelectric element 1 can be manufactured by the overlapping by coating on the inorganic piezoelectric element 3 an organic polymer sheet. Without an electrode layer being printed by using silver, gold, palladium or platinum paste, it is possible to overlap only a polymer sheet and then to form the reception-use organic piezoelectric element 1. As shown in FIG. 1, also, it is possible to provide the reception-use organic piezoelectric element 1 on an electrode layer.

Overlapping the reception-use organic piezoelectric element 1 may be carried out by solvent dissolution, flow casting and overlapping of a polymer.

Further, the inorganic piezoelectric element 3 and the reception-use organic piezoelectric element 1 may be bonded together by forming an electrode on either of inorganic and organic piezoelectric sheets and overlapping the sheets. Here, it is possible to consider factors like the emission and receiving sensitivity properties of piezoelectric elements and the I/O impedance of a driving or receiving circuit, to specify the thickness and material for each overlapping composition and then to manufacture emission and receiving piezoelectric elements. Thus it is preferable that the inorganic piezoelectric element 3 and the reception-use organic piezoelectric element 1 be implemented with their impedance specified in each instance.

For the material of a transmission-use inorganic piezoelectric element, PZT is often used. Recently lead-free PZTs have been recommended: crystal, lithium niobate ($LiNbO_3$), potassium niobate tantalate [K (Ta, Nb) $O_3$], barium titanate, ($BaTiO_3$), lithium tantalite ($LiTaO_3$), strontium titanate ($SrTiO_3$) or bismuth titanate ($BiTiO_3$).

For an organic piezoelectric sheet used for a reception-use organic piezoelectric element, a polymer piezoelectric coat like vinylidene fluoride/ethylene trifluoride copolymer or urea resin. Concerning the molecular weight of material polymers, the higher the molecular weight of a polymer, the stronger a piezoelectric coat.

As far as a vinylidene fluoride/ethylene trifluoride copolymer is concerned, the copolymerization proportion varies the electromechanical binding constant in the direction of thickness (piezoelectric effect), so for example the vinylidene fluoride copolymerization proportion 60 to 99 mol percent is preferable. But an optimal value for the proportion depends on the way to use an organic binding agent for overlapping a transmission-use inorganic piezoelectric element and a reception-use organic piezoelectric element. The most preferable vinylidene fluoride copolymerization proportion ranges from 85 to 99 mol percent. A polymer piezoelectric coat having 85 to 99 mol percent for vinylidene fluoride, 1 to 15 mol percent for a polymer like perfluoroalkylvinylether, perfluoroalkoxyethylene or perfluorohexaethylene reduces emission fundamental waves and raises the sensitivity of higher harmonics receiving, so is particularly desirable in the combination of a transmission-use inorganic piezoelectric element and a reception-use organic piezoelectric element. Conventionally tetrafluoroethylene and ethylene trifluoride have been favorably estimated, but for a compound element according to the present invention it is preferable to use perfluoroalkylvinylether (PFA), perfluoroalkoxyethylene (PAE) or perfluorohexaethylene for the combination of a transmission-use inorganic piezoelectric element and a reception-use organic piezoelectric element.

A reception-use organic piezoelectric element according to the present invention is manufactured for example by radical polymerization for copolymerizing several kinds of monomers with initiator, by photopolymerization with photosensitizer, by the vapor deposition polymerization of evaporating monomers under low ambient pressure at a low temperature to form a thin coat. Any of these methods can be selected as appropriate, according to the present invention, depending on monomer categories and copolymerization constitution proportion.

In a preferable mode of carrying out the present invention, polyurea is used in a reception-use organic piezoelectric element. A monomer for polyurea can be expressed with the general formula ONC—R—NCO, but the monomer may include alkylene group, phenylene group, bivalent heterocycle group where R can be replaced by any substitutional group. Polyurea that is a copolymerization between urea derivative and other monomer may be used. Preferable polyurea is aromatic polyurea in which 4,4'-diaminodiphenylmethane (MDA) and 4,4'-diphenylmethane diisocyanate (MDI) are copolymerized.

A reception-use organic piezoelectric element may be manufactured by vapor deposition in which a support (base board) where vapor deposition monomers are built up is of any material like glass, resin and silicon wafer, and a low-temperature coat may be formed as appropriate with polyester resin like polyethylene phthalate or polyethylene naphthalate, polycarbonate resin, silicon resin, alkylate resin and cycloolefin resin.

With the above-mentioned harmonic imaging technology, it is preferable that a reception-use organic piezoelectric element be an organic piezoelectric element sensitive enough to receive a higher harmonic second-order or more above the fundamental wave emitted from an emission piezoelectric element. To receive higher harmonics second-order or more, it is necessary that the frequency of the fundamental wave from an emission piezoelectric element is lower than the resonance frequency of a receiving piezoelectric element. The fundamental wave f1 is generally speaking selected from a range of 2 MHz to 20 MHz, but the n-th higher harmonic is particularly desirably 1.5 to 10 times the fundamental wave.

For the above-mentioned overlapping composition, an organic bonding material may be used. As an organic bonding material, for simplicity, an all-purpose adhesive may be used. Preferable organic bonding materials are as follows.

Such preferable organic bonding materials are for example the resins of polymers like polyvinylbutyral, polyolefin, polycycloolefin, polyacrylate, polyamide, polyimide, polyester, polysulfone, epoxy compound, silicone and their derivatives. Polyvinylbutyral is exemplified by the Chemical Substances Control Law existing chemical substance (6)-708 (CASNO. 63148-65-2). Polyamides are polyamide 6, polyamide 66, polyamide 610, polyamide 612, polyamide MXD6, polyamide 11, polyamide 12, polyamide 46, methoxy-bound polyamide, existing chemical substance (7)-383. Polyimide is represented by NASA-developed existing chemical substance (7)-2211 (CASENO. 611-79-0). Silicones are existing chemical substances (7)-476, (7)-474, (7)-477, (7)-483 and (7)-485. Epoxy compounds are polyphenol, polyglycidylamine, alcohol, ester, but aliphatic compounds are particularly desirable: for example, existing chemical substance Nos. 3-2452, 3-3453, 4-47 and 5-1052. Aliphatic compounds are good in thermal resistance and adhesivity, so are preferable for use.

These resins are used in the quantity appropriate for desired sensitivity, frequency properties and other factors, but in coat thickness 10 nm to 60 μm, preferably 20 nm to 30° μm.

The resins are used solved in a solvent like DMSO, DMF, DME and acetone, but no solvent may be used, a resin being heated to its melting temperature, thermally melted and then used.

A binding agent may be used on any layer of overlapped elements, but used preferably when a transmission-use inorganic piezoelectric element and a reception-use organic piezoelectric element are bonded together. It is possible that, a transmission-use inorganic piezoelectric element having an electrode already formed by printing or coating, a binding agent is used on a reception-use organic piezoelectric element where no electrode is printed thereon.

Next, a preferable structure of an ultrasonic probe according to the present invention is explained.

As shown in FIG. 1, an electrode layer 2 is provided on a transmission-use inorganic piezoelectric element 3 for transmitting ultrasonic waves by coating or spattering, and an organic piezoelectric element 1 is preferably laminated on the electrode layer 2 by coating or casting.

In this layer structure, an electrode and an organic piezoelectric element have their interfacial bonding force (adhesiveness) short resulting in the tendency to peel off, so it is preferable to use an organic bonding material between the electrode and the organic piezoelectric element. In other words, an organic biding layer is coated on the electrode layer and thereafter the organic piezoelectric element is formed on the organic binding layer. Here, roughing the surface of an organic bonding material layer and providing an organic piezoelectric element layer thereon by coating or flow casting adds to the bonding strength between an organic bonding material layer and an organic piezoelectric element layer and thus prevents the organic piezoelectric element from peeling off. Specifically, when the material of the organic piezoelectric element contains a fluorine resin, the boding strength between the electrode layer and the organic piezoelectric element becomes insufficient. Then, it may be preferable to conduct the following process in such a way that an organic biding layer is formed on the electrode layer, the surface of the organic biding layer is subjected to a roughing process to become a rough surface, and a solution containing a solvent and a fluorine resin is coated or cast on the rough surface of the organic binding layer so as to form an organic piezoelectric element containing the fluorine resin. In this case, with the action of the solvent, the bonding strength between the organic binding layer and the organic piezoelectric element can be increased more.

The surface of the binder layer coming in contact with the organic piezoelectric element layer has an arithmetic average roughness of 0.2 to 0.6 μm.

The roughing process can be conducted a mechanical roughness process such as a brush grinding process or a honing grinding process.

In the above layer structure, the thickness of the inorganic piezoelectric element 3 is preferably 100 to 700 μm and the thickness of the organic piezoelectric element 1 is preferably 5 to 50 μm. By making the inorganic piezoelectric element 3 relatively thicker, the strength for transmitting ultrasonic waves can be secured, on the other hand, by making the inorganic piezoelectric element 3 relatively thinner, a receiving sensitivity for ultrasonic waves reflected from the body can be enhanced. In this regard, the thickness of the electrode layer is preferably 0.5 to 5 μm and the thickness of the organic binding layer is preferably 0.5 to 5 μm.

A polarizing process according to the present invention is preferably given by direct current or alternating current application treatment or corona discharge treatment having a processing density of 1 to 1000 kW/m$^2$/min. A processing density lower than this range gives a less effective polarizing process, while one higher than the range causes dielectric breakdown because of dielectric heating. A range of 50 W/(m$^2$/min) to 900 kW/(m$^2$/min) is preferable, and one of 100 W/(m$^2$/min) to 100 kW/(m$^2$/min) is most preferable.

A voltage ranging from 1 to 100 kV, or preferably one ranging from 100 V to 60 kV may be used. An alternating current frequency ranging from 10 Hz to 100 MHz, or preferably from 100-Hz to 40 MHz, or more preferably from 1 kHz to 30 MHz may be used. An electric current density ranging from 0.1 mA to 100 A, or preferably from 1 mA to 10 A may be used. A voltage, electric current or frequency higher than the above-mentioned range causes the dielectric breakdown of polymer coating while a voltage, electric current or frequency not higher than this range gives a value not higher than the threshold causing polymerization, and makes no piezoelectric effect. The density unit W/(m$^2$/min) is expressed using the value (Wp/(L×V)) given by dividing the output Wp by the product of the length L m of the electrode of each apparatus and the processing speed V m/min.

A polarizing process according to the present invention can also be achieved by pulse voltage application. Compared with the continuous application of voltage, pulse voltage application is short in application duration, so a high voltage can be applied. For pulse voltage application, a pulse high voltage field whose voltage ranges from 1 to 1000 kV/cm, preferably from 1 to 100 kV/cm, more preferably from 10 to 70 kV/cm and whose pulse interval ranges from 100 ms to a picosecond, preferably from 10 ms to 100 μs is impressed and then gradually lowered to room temperature. With this method it is possible that the presence of inorganic piezoelectric substances blocks dielectric breakdown and raises the voltage applied to the surface of piezoelectric coating. As a result, it is possible to impress an electric field sufficient for piezoelectricity to appear and obtain an organic piezoelectric substance efficient in piezoelectric properties. This method according to the present invention is effective particularly for an ultrasonic probe formed from a multi-layer piezoelectric material made up of an inorganic piezoelectric substance and an organic piezoelectric substance.

For a polarizing process according to the present invention, a temperature ranging from normal to 400° C. (melting point for polymer) is adopted, preferably 40 to 300° C., more preferably 60 to 200° C.

It is possible to carry out a polarizing process either before or after forming an electrode. An electrode may be buried in the surface of a coat either completely or so partially as to give anchor effect.

Though not shown in FIGS. 1 to 4, for the focusing of ultrasonic waves it is possible to bind an acoustic lens to a secondary consistency layer in contact with a transmission-use inorganic piezoelectric element. The secondary consistency layer is of a two-layer composition, but may be of a multi-layer, a single-layer or no-layer composition depending upon the patient. A preferable number of consistency layers ranges from 2 to 3.

Employing an ultrasonic probe described so far allows the processibility of organic materials to be taken advantage of to give a medical ultrasonograph with low cost and high sensitivity. In the following embodiments there will be shown an experimental ultrasonic probe and its performances.

Embodiments

Now, embodiments of the present invention will be described in the concrete, but not intended as definitions of the limits of the invention.

Embodiment 1

Manufacturing and Evaluation of Ultrasonic Probes
<<Manufacturing of Emission Piezoelectric Elements>>
<Coat S1: Manufacturing of Titanic Acid Piezoelectric Elements Containing No Lead>

As component materials $CaCO_3$, $La_2O_3$, $Bi_2O_3$ and $TiO_2$ and as a subordinate component material MnO were prepared so that these component materials could turn out to weigh $(Ca_{0.97} La_{0.03}) Bi_{4.01} Ti_4O_{15}$. Then, adding purified water, stirring for 8 hours in a ball mill containing zirconia medium in the purified water and sufficient drying obtained a mixture powder. The obtained mixture powder was tentatively molded, burned at 800° C. for 2 hours in the air to give tentative ware. And this tentative ware was put in purified water, pulverized in a ball mill containing zirconia medium in the purified water and dried to obtain piezoelectric ceramic material powder. This pulverization was varied in duration and conditions to give various piezoelectric ceramic material powders whose granules were 100 nm in diameter. These various piezoelectric ceramic material powders which were different in granule diameter were put in binder purified water at 6 percent by mass, press-molded into plate-shaped tentative molds 100 μm thick. These plate-shaped tentative molds were vacuum-packed, and were press-molded under a pressure of 235 MPa. The molds were then burned into final sinters 520 μm thick. Their burning temperature was 1100° C. An inorganic piezoelectric layer was polarized by applying an electric field of 3×Ec (MV/m) for 1 minute thereto.

<Coat S2: Manufacturing of a PZT Piezoelectric Element (Ordinary Element Containing Lead)>

PZT is a material containing lead, zirconium and titanium in the range expressed by $Pb (Zr_{1-x}Ti_x) O_3$ ($0.47 \leq x \leq 1$). Here PZT in which x=0.2 was manufactured. The oxides of these substances were weighed, put in pure water, stirred for 8 hours in a ball mill containing zirconia medium in the purified water and sufficiently dried to obtain a mixture powder. The obtained mixture powder was tentatively molded, burned at 800° C. for 2 hours in the air to give tentative ware. And this tentative ware was put in purified water, pulverized in a ball mill containing zirconia medium in the purified water and dried to obtain a piezoelectric ceramic material powder. This piezoelectric ceramic material powder was put in binder purified water at 6 percent by mass, press-molded into a plate-shaped tentative mold 260 μm thick. This plate-shaped tentative mold was vacuum-packed, and was press-molded under a pressure of 235 MPa. The mold was then burned into a final sinter 250 μm thick. Its burning temperature was 1100° C. An inorganic piezoelectric layer was polarized by applying an electric field of 3×Ec (MV/m) for 1 minute thereto.

These inorganic piezoelectric elements (layers) were provided with electrode layers having a thickness of 2 μm with a silver paste thereon, then, a polyvinylbutyral type organic binding layer having a thickness of 2 μm was coated on the electrode layers and the surface of the organic binding layer was subjected to a roughing process with brush polishing so as to have an arithmetic average roughness of 2 μm. Thereafter, the organic piezoelectric layers (coats M1 to M6) further were formed on the rough surface of the organic binding layer (by coating, flow casting or deposition) in the combination shown in Table 1.

<<Manufacturing of Receiving Piezoelectric Elements (Layers)>>
<Manufacturing of Coat M1>

Coat P (VDF-PFA) (composition molar proportion: VDF/perfluoroalkylvinylether=90/20) is a coat 28 μm thick manufactured by flow casting with a DMF (dimethylformamide) solution.

<Manufacturing of Coat M2>

Coat P (VDF-PFE) (composition molar proportion: VDF/perfluoroalkylvinylether=88/12) is a coat 28 μm thick manufactured by flow casting with a DMF (dimethylformamide) solution.

<Manufacturing of Coat M3>

Coat P (VDF-HFP) (composition molar proportion: VDF/HFP (hexafluoropropylene)=86/12) is a coat 25 μm thick manufactured by flow casting with a DMF (dimethylformamide) solution.

<Manufacturing of Coat M4>

Coat P (VDF-HFP) (composition molar proportion: VDF/HFP (hexafluoropropylene)=86/12) is a coat 29 μm thick manufactured by solution in a DMF (dimethylformamide) solution, addition of carbon nanotube at 3 percent by mass, kneading with a blender and then flow casting.

<Manufacturing of Coat M5>

For monomers, 4,4'-diaminodiphenyl methane (MDA), 4,4'-diphenylmethane diisocyanate (MDI) were selected to carry out vapor deposition polymerization. MDA was put in a tray in a $2 \times 10^{-3}$ Pa vacuum chamber, heated to 100° C. and then vapor-deposited into a thickness of 480 μm on 200 μm-thick polyethylene phthalate resin (PET) heated to 66° C. and aluminized to give a base board located on top of the chamber. The obtained MDA/MDI proportion was 1.1.

<Manufacturing of Coat M6>

VDF/TrFE (75/25 for molar proportion) copolymer (manufactured by Kureha Chemical Industry Co., Ltd.) was stirred and solved in an acetone solution at normal temperature to give a solution of 4-percent-by-mass polymer concentration. This solution was used in casting on a glass plate.

These organic coats, electrodes and then leads were provided, and a polarizing process was carried out.

Polarizing processes employed the following power sources: for direct current high-voltage power supply HDV-100K1US (1 to 100 kV) manufactured by Pulse Electronic Engineering Co., Ltd., for alternating current high-voltage power supply KAC15-5VA (0 to 15 kV, 5 mA) manufactured by Kasuga Electric Co., Ltd., for high-voltage alternating current pulse generator PG-3K02 (1 to 3 kV, 0.2 A, 2 to 20 μS for pulse width, 10 to 100 Hz for repetition frequency) and for corona discharge treatment CT-0112 manufactured by Kasuga Electric Co., Ltd. Their use conditions are shown in Table 1. The corona discharge device used has an output of 1 kW, a frequency of 35 kHz and a discharge irradiation unit of $W/m_2/min$.

Corona discharge treatment had an inorganic piezoelectric layer located on the discharge surface side. Samples Nos. 122 to 125 and 128 to 130 (when an organic piezoelectric layer was located on the discharge surface side) had dielectric breakdown observed on the surface of the organic piezoelectric layer owing to corona discharge.

<<Evaluation Method>>

Polarizing processes were carried out, ultrasonic probe samples are manufactured, the 7.5 MHz fundamental frequency f1 was emitted, and then, with the receiving higher harmonic f2, 15 MHz relative receiving sensitivities were obtained.

To measure relative receiving sensitivities, a sound intensity measuring system (1 to 50 MHz), Model 805 manufactured by Sonora Medical System Inc., 2021 Miller Drive Longmont, Colo. (0501 USA) was used. And ordinary consistency layers and backing layers were used.

Ultrasonic probes can be manufactured by other methods as follows.

The above-mentioned silver-electrode-installed emission piezoelectric elements (inorganic piezoelectric coats) had separately manufactured reception-use organic piezoelectric elements (organic piezoelectric coats) overlapping therewith, M1 to M4 at 288° C. and M5 at 180° C. were laminated and stuck fast by the application of a pressure of 50 kPa for 15 minutes. Then, the surfaces of the reception-use organic piezoelectric element coats on the exposed side (organic piezoelectric layers) were gold-metalized to form electrodes, resulting in probes. (The above-mentioned "separately manufactured reception-use organic piezoelectric elements (organic piezoelectric coats)" are organic piezoelectric elements separately manufactured on base boards, removed from the base boards and then put to use. Before removed from the base boards, the surfaces of the base boards were siliconized as in ordinary methods.)

The results are shown in Tables 1 and 2.

TABLE 1

| | Composition of Piezoelectric Layer | | Polarizing Process (Application Method) | | | | | | | |
|---|---|---|---|---|---|---|---|---|---|---|
| | (Inorganic) Emission | (Organic) Receiving Piezoelectric | Application of Direct | Application of Direct Current Pulse Wave | | | Application of Direct | Corona Discharge | | |
| Sample No. | Piezoelectric Element (Layer) | Element (Coat, Layer) | Current (W/(m$^2$/min)) | (W/(m$^2$/min)) | Pulse Width (μs) | Repetition Frequency (Hz) | Current (W/(m$^2$/min)) | Treatment (W/(m$^2$/min)) | Relative Sensitivity | Remarks |
| 100 | S6 | None | — | — | — | — | — | — | 50 | Comp. |
| 101 | None | M6 | — | — | — | — | — | — | 50 | Comp. |
| 102 | S6 | M6 | 50 W | — | — | — | — | — | 100 | Inv. |
| 103 | S6 | M6 | 100 W | — | — | — | — | — | 110 | Inv. |
| 104 | S6 | M6 | 1 kW | — | — | — | — | — | 120 | Inv. |
| 105 | S6 | M6 | 100 kW | — | — | — | — | — | 130 | Inv. |
| 106 | S6 | M6 | 900 kW | — | — | — | — | — | 105 | Inv. |
| 107 | S6 | M6 | 1200 kW | — | — | — | — | — | 90 | Inv. |
| 108 | S6 | M6 | — | 50 kW | 20 | 60 | — | — | 180 | Inv. |
| 109 | S6 | M6 | — | 100 kW | 15 | 60 | — | — | 200 | Inv. |
| 110 | S6 | M6 | — | 1 kW | 10 | 60 | — | — | 230 | Inv. |
| 111 | S6 | M6 | — | 100 kW | 10 | 60 | — | — | 200 | Inv. |
| 112 | S6 | M6 | — | 900 kW | 5 | 60 | — | — | 180 | Inv. |
| 113 | S6 | M6 | — | 1200 kW | 2 | 60 | — | — | 160 | Inv. |
| 114 | S6 | M6 | — | — | — | — | 50 W | — | 105 | Inv. |
| 115 | S6 | M6 | — | — | — | — | 100 W | — | 130 | Inv. |
| 116 | S6 | M6 | — | — | — | — | 1 kW | — | 150 | Inv. |
| 117 | S6 | M6 | — | — | — | — | 100 kW | — | 80 | Inv. |
| 118 | S6 | M6 | — | — | — | — | 900 kW | — | 75 | Inv. |
| 119 | S6 | M6 | — | — | — | — | 1200 kW | — | 70 | Inv. |

Comp.: For Comparison,
Inv.: The Invention

TABLE 2

| | Composition of Piezoelectric Layer | | Polarizing Process (Application Method) | | | | | | | |
|---|---|---|---|---|---|---|---|---|---|---|
| | (Inorganic) Emission | | Application of Direct | Application of Direct Current Pulse Wave | | | Application of Direct | Corona Discharge | | |
| Sample No. | Piezoelectric Element (Layer) | *1 | Current (W/(m$^2$/min)) | (W/(m$^2$/min)) | Pulse Width (μs) | Repetition Frequency (Hz) | Current (W/(m$^2$/min)) | Treatment (W/(m$^2$/min)) | Relative Sensitivity | Remarks |
| 120 | S6 | M6 | — | — | — | — | — | 50 W | 160 | Inv. |
| 121 | S6 | M6 | — | — | — | — | — | 100 W | 190 | Inv. |
| 122 | S6 | M6 | — | — | — | — | — | 1 kW | 200 | Inv. |
| 123 | S6 | M6 | — | — | — | — | — | 100 kW | 180 | Inv. |
| 124 | S6 | M6 | — | — | — | — | — | 900 kW | 160 | Inv. |
| 125 | S6 | M6 | — | — | — | — | — | 1200 kW | 120 | Inv. |
| 126 | S6 | M6 | — | 100 W | 15 | 60 | — | 50 W | 260 | Inv. |
| 127 | S6 | M6 | — | 1 kW | 10 | 60 | — | 100 W | 270 | Inv. |
| 128 | S6 | M6 | — | 100 kW | 10 | 60 | — | 1 kW | 280 | Inv. |
| 129 | S6 | M6 | — | 900 kW | 5 | 60 | — | 100 kW | 270 | Inv. |
| 130 | S6 | M6 | — | 1200 kW | 2 | 60 | — | 900 kW | 250 | Inv. |
| 131 | S1 | M1 | — | 1 kW | 10 | 60 | — | 1 kW | 220 | Inv. |
| 132 | S1 | M2 | — | 1 kW | 10 | 60 | — | 1 kW | 220 | Inv. |
| 133 | S1 | M3 | — | 1 kW | 20 | 60 | — | 1 kW | 205 | Inv. |

TABLE 2-continued

| | Composition of Piezoelectric Layer | | Polarizing Process (Application Method) | | | | | | |
|---|---|---|---|---|---|---|---|---|---|
| | (Inorganic) Emission | | Application of Direct | Application of Direct Current Pulse Wave | | | Application of Direct | Corona Discharge | | |
| Sample No. | Piezoelectric Element (Layer) | *1 | Current (W/(m²/min)) | (W/(m²/min)) | Pulse Width (μs) | Repetition Frequency (Hz) | Current (W/(m²/min)) | Treatment (W/(m²/min)) | Relative Sensitivity | Remarks |
| 134 | S1 | M4 | — | 1 kW | 15 | 60 | — | 1 kW | 205 | Inv. |
| 135 | S1 | M5 | — | 1 kW | 10 | 60 | — | 1 kW | 230 | Inv. |
| 136 | S1 | M1 | — | 1 kW | 10 | 60 | — | 1 kW | 205 | Inv. |
| 137 | S1 | M2 | — | 1 kW | 5 | 60 | — | 1 kW | 150 | Inv. |
| 138 | S6 | M3 | — | 1 kW | 2 | 60 | — | 1 kW | 130 | Inv. |
| 139 | S6 | M6 | — | — | — | — | — | — | 50 | Comp. |
| 140 | S1 | M1 | — | — | — | — | — | — | 50 | Comp. |

Comp.: For Comparison,
Inv.: The Invention
*1: (Organic) Receiving Piezoelectric Element (Coat, Layer)

From Tables 1 and 2, it is understood that it is possible according to the present invention to provide an array-type ultrasonic probe having emission separate from receiving and improved into high sensitivity and low-cost for use in equipment like a medical diagnostic ultrasonograph.

What is claimed is:

1. A method of producing an ultrasonic probe, comprising the steps of:
   superimposing an ultrasonic wave receiving organic piezoelectric element layer made of an organic material on an ultrasonic wave transmitting inorganic piezoelectric element layer made of an inorganic material, wherein the ultrasonic wave transmitting inorganic piezoelectric element layer is adapted to receive electric signals and emits ultrasonic waves to the outside of the ultrasonic probe in response to the electric signals, and the ultrasonic wave receiving organic piezoelectric element layer is adapted to receive ultrasonic waves from the outside of the ultrasonic probe and generates electric signals in response to the ultrasonic waves; and
   polarizing the ultrasonic wave receiving organic piezoelectric element layer and the ultrasonic wave transmitting inorganic piezoelectric element layer on a condition that the ultrasonic wave receiving organic piezoelectric element layer is superimposed on the ultrasonic wave transmitting inorganic piezoelectric element layer.

2. The method described in claim 1, wherein the polarizing step is conducted with a DC voltage applying step, a AC voltage applying step or a corona discharging step.

3. The method described in claim 2, wherein the polarizing step is conducted with a polarizing density of 1 to 1000 kW/m²/minute.

4. The method described in claim 2, wherein in the corona discharging step, a corona is discharged onto a surface of the ultrasonic wave transmitting piezoelectric element layer.

5. The method described in claim 2, wherein in the DC voltage applying step, the DC voltage is applied intermittently in a form of pulse.

6. The method described in claim 1, wherein the inorganic material is one of PZT, crystal, lithium niobate ($LiNbO_3$), potassium niobate tantalate [$K(Ta, Nb)O_3$], barium titanate, ($BaTiO_3$), lithium tantalite ($LiTaO_3$), strontium titanate ($SrTiO_3$) or bismuth titanate ($BiTiO_3$).

7. The method described in claim 1, wherein the organic material is a resin containing a composition of at least one selected from a group of polyvinylidene fluoride, poly urea, polyamide, polyimide, polyester and polyolefin, in an amount of 60 mol % to 100 mol %.

8. The method described in claim 1, further comprising the steps of:
   forming an electrode layer on the ultrasonic wave transmitting inorganic piezoelectric element layer, and
   forming the ultrasonic wave receiving organic piezoelectric element layer on the electrode layer in the step of superimposing.

9. The method described in claim 8, further comprising the steps of:
   forming a binder layer on the electrode layer, and
   forming the ultrasonic wave receiving organic piezoelectric element layer on the binder layer in the step of forming the ultrasonic wave receiving organic piezoelectric element layer.

10. The method described in claim 9, wherein the binder layer is composed of polyvinylbutyral, polyolefin, polycycloolefin, polyacrylate, polyamide, polyimide, polyester, polysulfone, epoxy compound, or silicone.

11. The method described in claim 9, wherein the step of forming the ultrasonic wave receiving organic piezoelectric element layer is a step of coating a liquid containing the organic material and solvent on the binder layer.

12. The method described in claim 9, further comprising the step of:
   roughing a surface of the binder layer to an arithmetic average roughness of 0.2 to 0.6 μm before the step of forming the ultrasonic wave receiving organic piezoelectric element layer.

13. The method described in claim 1, wherein the ultrasonic probe is used to medical diagnostics.

* * * * *